United States Patent [19]

Onishi et al.

[11] Patent Number: 5,229,357
[45] Date of Patent: * Jul. 20, 1993

[54] METHOD OF PRODUCING SUPERCONDUCTING CERAMIC WIRE AND PRODUCT

[75] Inventors: Masashi Onishi; Takashi Kohgo; Tetsuya Ohsugi; Gotaro Tanaka, all of Yokohama, Japan

[73] Assignee: Sumitomo Electric Industries, Ltd., Osaka, Japan

[*] Notice: The portion of the term of this patent subsequent to Dec. 4, 2007 has been disclaimed.

[21] Appl. No.: 612,457

[22] Filed: Nov. 14, 1990

Related U.S. Application Data

[63] Continuation-in-part of Ser. No. 585,640, Sep. 20, 1990, abandoned, which is a continuation of Ser. No. 435,039, Nov. 13, 1989, Pat. No. 4,975,416.

[30] Foreign Application Priority Data

Nov. 18, 1988 [JP] Japan .................. 63-292210
Oct. 4, 1989 [JP] Japan .................. 1-259828

[51] Int. Cl.$^5$ .............................. C03B 37/00
[52] U.S. Cl. .............................. 505/1; 65/2; 65/33; 505/733; 505/740; 505/742
[58] Field of Search .......... 65/2, 3.3, 33, 114; 427/62, 63; 505/704, 725, 733, 739, 740, 741, 742, 782, 785

[56] References Cited

U.S. PATENT DOCUMENTS

4,134,747 1/1979 Pierson et al. ............. 65/33
4,861,751 8/1989 Tenhover .................. 427/62

FOREIGN PATENT DOCUMENTS

285168 10/1988 European Pat. Off. .
61-225808 10/1986 Japan .
64674 1/1989 Japan ............... 505/740
1-134819 5/1989 Japan ............... 505/740

OTHER PUBLICATIONS

Miura et al., As-grown crystallized thin film of Bi-Sr-Ca-Cu-O and its low-temperature annealing effect, Appl. Phys. Lett. 55(15), 10 Apr. 1989, pp. 1474–1476.
Lee et al., Effect of oxygen partial pressure on the transformation between high $T_c$ and low $T_c$ phases in a Bi-Pb-Sr-Ca-Cu-O system, Appl. Phys. Lett. 55(12), 18 Sep. 1989, pp. 1249–1251.
Tanaka et al., Composition dependence of high $T_c$ phase formation in Pb-doped Bi-Sr-Ca-Cu-O thin films, Appl. Phys Lett. 55(-2), 18 Sep. 1989, pp. 1252–1254.
Jin et al., High $T_c$ superconductors-composite wire fabrication, Appl. Phys. Lett. 51(3), 20 Jul. 1987, pp. 203–204.
Zheng et al., $Bi_4Ca_3Sr_3Cu_4O_y$ ceramic fibers from crystallization of glasses, Appl. Phys. Letts. 55(12), 18 Sep. 1989, pp. 1255–1257.
Rokecl et al., 115K Superconductiveity in Bi-Pb-(Ag,Nb,Sb)-Sr-Ca-Cu-O Systems, Solid State Communications, vol. 72, No. 1, pp. 113–116, 1989.
Skumryev, et al., Physical Properties of $Bi_1Ca_1Sr_1Cu_2O_x$ Superconductor Obtained by Rapid Quenching from the Melt, Physica C 152 (1988), pp. 315–320.
Yurek et al., Direct Synthesis of a Metal/Superconducting Oxide Composite by Oxidation of a Metalllic Precursor, Journal of the Electrochemical Society, vol. 134, No. 10, Oct. 1987, pp. 2635–2636.

(List continued on next page.)

Primary Examiner—Robert L. Lindsay
Attorney, Agent, or Firm—Stevens, Davis, Miller & Mosher

[57] ABSTRACT

A superconducting ceramic wire is produced by melting a superconducting ceramic-forming metal oxide composition, and quenching the melt into a glass which is then formed into a preform of thin plate. The preform is soften and wire-drawn without causing crystallization in a furnace into a flexible elongated thin tape having a thickness of e.g. 40 to 60 μm. The tape is heat-treated for crystallization to obtain the superconducting wire. The disclosure mentions mainly Bi Bi-Sr-Ca-Cu-O superconducting systems.

23 Claims, 6 Drawing Sheets

OTHER PUBLICATIONS

Superconductivity Conference, 21 Aug. 1988, San Francisco, US.

Komatsu et al., "Preparation of High-$T_c$ Superconducting Bi-Pb-Sr-Ca-Cu-O Ceramics by the Melt Quenching Method", Japanese Journal of Applied Physics, vol. 27, No. 12, Dec. 1988, pp. L2293-L2295, Tokyo, JP.

Bhargava, et al., Crystallization of $Ba_2YCu_3O_x$ From Glasses in the System $BaO-Y_2O_3-CuO-B_2O_3$, Materials Research Society, Extended Abstracts, Apr. 5-9, 1988, pp. 59-61.

Zheng et al., $Bi_4Sr_3Ca_3Cu_4O_{16}$ glass and superconducting glass ceramics, Physical Review B, vol. 38, No. 10, Oct. 1, 1988, pp. 7166-7168.

Ramesh et al., Polytpoid structure of Pb-modified Bi-Ca-Sr-Cu-O superconductor, Physical Review B., vol. 38, No. 10, Oct. 1, 1988, pp. 7070-7072.

Jin et al., Fabrication of Dense $Ba_2YCu_3O_{7-b}$ Superconductor Wire by Molten Oxide Processing, Appl. Phys. Lett., Sep. 28, 1987, PTO Aug. 13, 1987.

Jin et al., superconductivity in the Bi-Sr-Ca-Cu-O compounds with noble metal additions, Appl. Phys. Lett. 52(19), 9 May 1988, pp. 1628-1630.

Komatsu et al., "High $T_c$ Superconducting Glass Ceràmics Based on the Bi-Ca-Sr-Cu-O System", IEEE Transactions on Magnetics, vol. 25, No. 2, Mar. 1989, pp. 2150-2153, IEEE, New York, US, and Applied

METHOD OF PRODUCING SUPERCONDUCTING CERAMIC WIRE AND PRODUCT

RELATED APPLICATIONS

This is a continuation-in-part application of application Ser. No. 585,640 filed on Sep. 20, 1990 and now abandoned, which is a continuation of our application No. 435,039 filed on Nov. 13, 1989, now U.S. Pat. No. 4,975,416 for METHOD OF PRODUCING SUPERCONDUCTING CERAMIC WIRE.

BACKGROUND OF THE INVENTION

1. Field of the Invention

The present invention relates to a method of producing superconducting ceramic wire. More particularly, it relates to a method of producing a superconducting ceramic wire from a metallic oxide glass material obtained by melt-quenching a metal oxide-forming chemical composition capable of being converted into a superconducting ceramic.

2. Description of the Prior Art

The production of superconducting ceramic wire has been thought to be very difficult due to the brittleness of the material. Hitherto, the wire is barely produced by so-called "noble metal-sheathed drawing method" in which a superconducting oxides composition is preliminarily sintered, packed in a noble metal sheath or pipe such as silver in a fine pulverized form, and then subjected to cold working to form a drawn wire of the sintered material, followed by a heat treatment to give a superconducting wire. In this method, the pipe may, if possible, be removed by dissolving with chemicals.

According to the above method, the use of the noble metal pipe is not only costly but also restricts the length of the resulting wire. Further, the continuity of the sintered powder is liable to break during the cold working, making wire-working difficult and causing poor flexibility in the resulting wire. Further more, the cover of the noble metal is liable to limit the supply of oxygen during the heat treatment, which has an important role in preparing superconducting ceramics.

SUMMARY OF THE INVENTION

An extensive effort has been made to resolve the above problem of the prior art, and this invention has been achieved, resolving this problem.

The present invention is directed to a method of producing a superconducting ceramic wire which comprises:

(a) homogeneously melting a mixture of oxygen-bearing metal compounds capable of being converted into a superconducting ceramic, and quenching the melt to form a glass, (b) forming a preform of the glass, (c) wire-drawing the preform while maintaining an amorphous state of the glass, and (d) heat-treating the drawn glass to cause recrystallization thereof.

The invention is conveniently applied to the production of a superconducting ceramic wire of a (Bi plus Pb)-Sr-Ca-Cu-O system in which Pb is absent or present in an atomic weight ratio of up to 35% of (Bi plus Pb).

The present invention will become more fully understood from the detailed description given below and the accompanying drawings which are given by way of illustration only, and thus are not to be considered as limiting the present invention.

The further scope of applicability of the present invention will become apparent from the detailed description. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
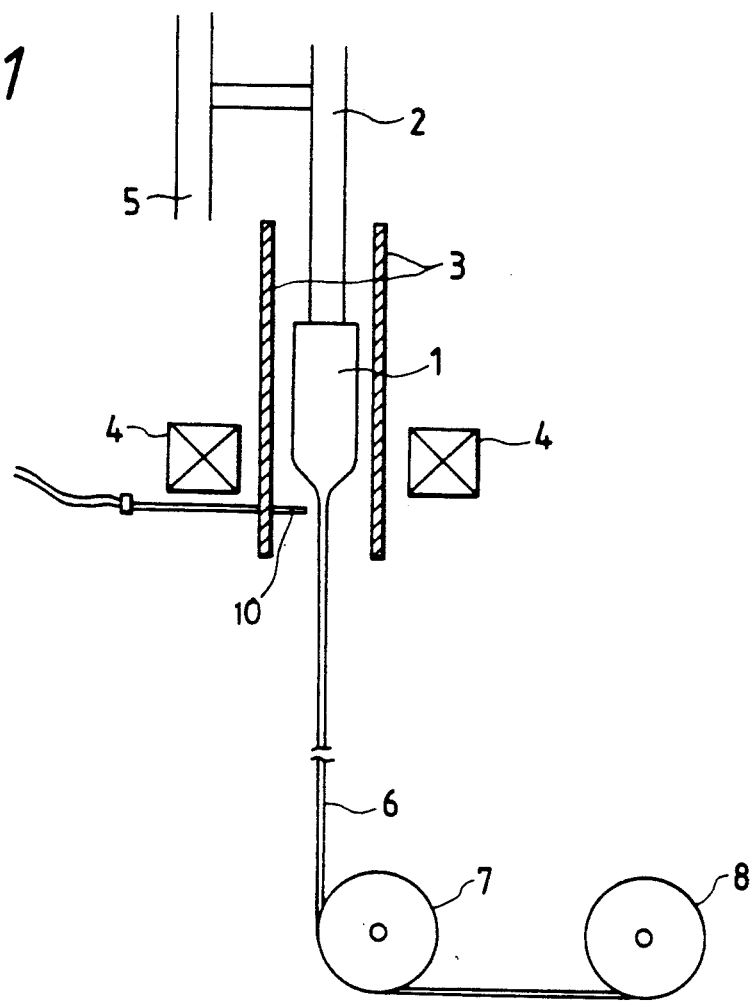
FIG. 1 is a sectional elevation view of a wire-drawing apparatus as a schematically illustrated working system, for explaining the present invention.

Superconducting oxide systems for example, Tl-system etc. are known, and the present process will be applicable thereto. However, the present invention will concretely be explained by referring to the production of a wire of Bi-Sr-Ca-Cu-O system (hereinafter referred to as system A) and (Bi+Pb)-Sr-Ca-Cu-O system (hereinafter referred to as system B) in which a part of the Bi in system A is substituted by Pb.

The metallic oxide-forming chemical composition capable of being converted into a superconducting ceramic usable in the present invention may be of any chemical compounds bearing oxygen atoms or mixtures thereof as long as it becomes superconductive when converted into a ceramic and subjected to a superconducting treatment. The chemical compounds are thoroughly mixed, if necessary, with aid of a liquid such as ethyl alcohol, which can easily be removed. The not limitative example of the composition used in the above exemplified system A and B includes a mixture selected in desired combination from metal oxides, carbonates or nitrates such as $Bi_2O_3$, $PbO$, $SrCO_3$, $CaCO_3$, $CuO$, $Ca(NO_3)_2$, $Sr(NO_3)_2$, $Cu(NO_3)_2$, $Bi(NO_3)_3$ and/or $Pb(NO_3)_2$. The preferable mol. ratio of the chemical compounds is, for example, $(BiO_{1.5}+PbO)$: $SrCO_3$: $CaCO_3$: $CuO = 2$ to $4:2:2:3$ or $4$, in which PbO may be absent, and the ratio of the metals other than Pb, which is more volatile, is almost maintained in the resulting superconducting system. According to the present invention, system B is preferably used and Bi may be substituted up to 35%, and preferably in a range of from 10 to 35%, by Pb.

The chemical composition is molten in a crucible by heating at a temperature higher than the melting point of a composition. The crucible used is of refractory material such as alumina, magnesia and other metal oxides and combination thereof or of a noble metal such as platinum, palladium and palladium-gold alloy. Among them, platinum or alumina crucible are preferable. The temperature used is preferably not more than 400° C. plus the melting point of the composition to prevent the evaporation of the essential ingredients having a comparatively high vapor pressure and the fusing-out of the crucible material or component thereof.

In the preparation of the above exemplified superconducting oxide systems, the temperature is preferably $1150° \pm 100°$ C. The melting process is continued until the chemical composition decomposes and a homogeneous melt is obtained. In case of the above systems, the time is as fast as possible and generally within 1 hour. If the chemical composition contains a carbonate or nitrate, it may preliminary be calcined at about 800° C. to remove carbon or nitrogen oxide.

The thus prepared melt is quenched to form a glass which is substantially amorphous. The quenching is simply carried out by pouring the melt onto a metal plate such as an iron plate, pressed quickly to a thickness of about 1 mm, and preferably annealed at about 300° C. for relaxation of the internal stress.

The melt-quenched glass plate is cut into a preform of an elongated plate or rod, and wire-drawn to obtain a glass wire having a desired dimension. The step will be explained by referring to the attached drawings.

As shown in FIG. 1, the preform 1 is fixed downwards to an end of dummy rod 2 and suspended in a quartz pipe 3 surrounded by a heater 4. When the rod 2 is put down by a transfer means 5, the glass preform 1 fixed to the rod 2 is heated by the heater 4 to soften, thereby commencing wire-drawing. The softening temperature is measured by a thermocouple 10 provided in the quartz pipe 3. A drawn wire 6 is wound up on a winding means 8 via a capstan 7. Though the temperature used may be different depending upon the respective oxide system, it is desirable to be a temperature corresponding to a viscosity of the soften glass ranging from $10^6$ to $10^4$ poises, which will decide the dimension of the drawn wire in a form of desired shape, for example, thin tape.

The glass state of the preform is maintained during the wire-drawing step by controlling precisely the drawing temperature so as to be kept at a temperature specific to the composition of the glass. For example, the temperature specific to $Bi_{1.5}SrCaCu_2O_y$ (y is non-constant) is quantitatively in such a narrow range as 421° C. to 423° C.

Figure 10:
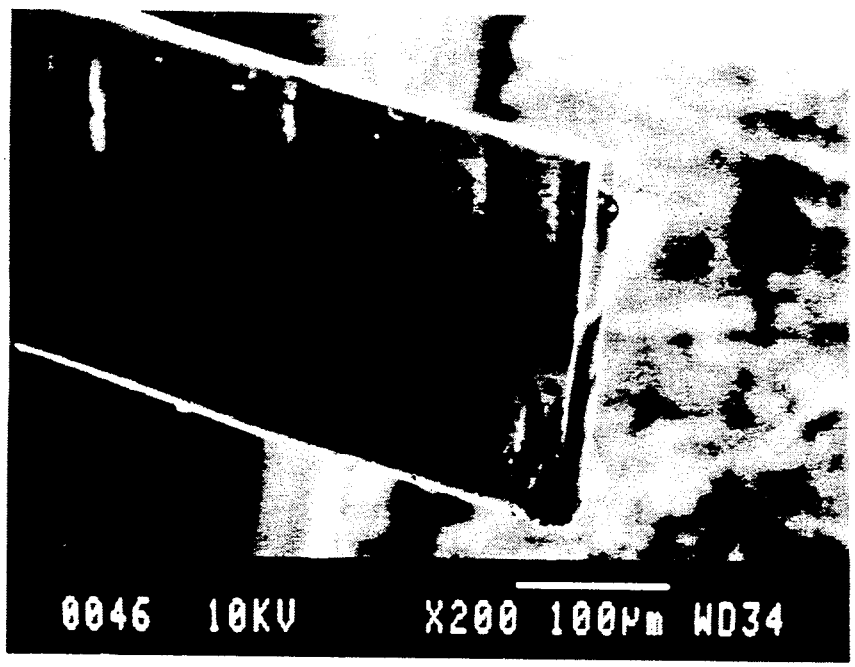
FIG. 10 is a scanning electron micrograph of the wire-drawn thin tape.

FIG. 10 shows the scanning electron micrograph of a sample of the $Bi_{1.5}SrCaCu_2O_y$ wire-drawn thin tape.

Next, the drawn glass wire is heat-treated to produce superconductivity, that is, to recrystallize. The step is generally conducted in air or molecular oxygen under the following condition. The glass wire is kept at a crystal nucleus-forming temperature or a temperature making the rate of formation of crystal nuclei maximum (hereinafter referred to as 1st stage heating) for more than 1 hour, and then at a crystal-growing temperature or a temperature making the rate of growth of crystals maximum (hereinafter referred to 2nd stage heating) for more than 20 hours. In the exemplified systems A and B, the 1st stage heating temperature is one corresponding to a viscosity of the glass ranging from $10^{11}$ to $10^{12}$ poises, and in the range of about 420° C. to about 430° C.

On the other hand, though the 2nd stage heating temperature is different depending on the composition of the system, it may be generally be 800° C. to 870° C. The 1st stage heating may be omitted, and the glass wire may undergo only the 2nd stage heat-treatment. The heat-treated wire is cooled in air.

Figure 11:
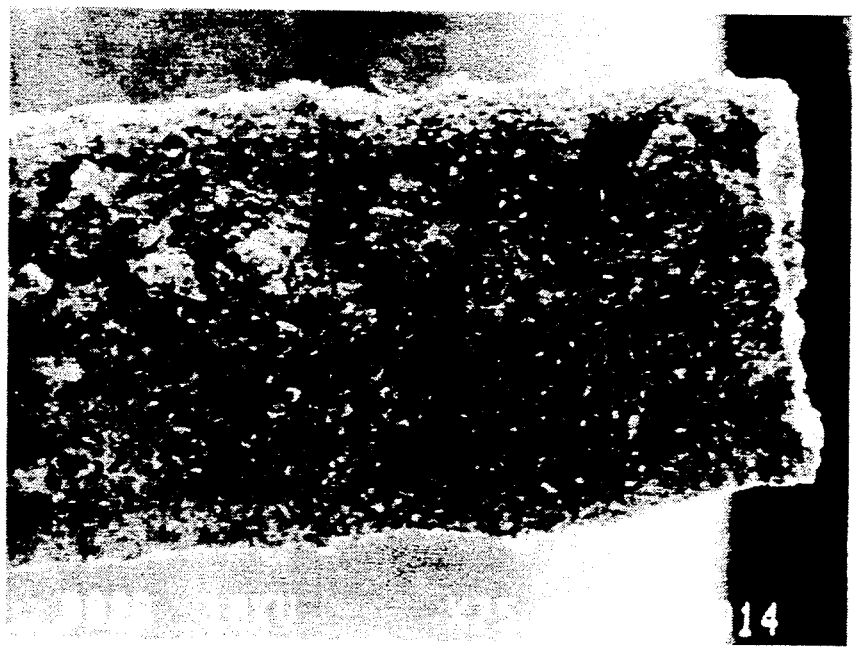
FIG. 11 is a scanning electron micrograph of the present superconducting wire.

FIG. 11 shows the scanning electron micrograph of a sample after heat-treatment which corresponds to that shown in FIG. 10.

It has been found according to the invention that when the 2nd stage heat-treatment is conducted with respect to a drawn glass partly contacted with silver, a surprising enhancement of the critical current density (Jc) can be achieved. For example, a drawn glass thin tape is placed on a silver plate and undergoes the 2nd stage heat-treatment at a relatively high temperature such as 840° C. to 870° C. in $O_2$ flow.

Also, the heat treatment may be conducted in an atmosphere of the saturated vapor of the essential atom barring the oxygen atoms such as PbO. Further, silver (Ag) acting as nucleus-forming adjuvant and having no deteriorating influence in superconductivity (Jpn. J. Appl. Phys. Letter, 52(19), May 9, 1988) may be added to the starting chemical composition to accelerate the formation of crystal nuclei occurring in this stage.

To the method of the present invention is further added the following step(s), alone or in combination, (e) applying pressure to the recrystallized drawn glass in the step (d) with or without a metal cover to cause the orientation of crystals in the longitudinal direction, and (f) conducting further heat-treatment of the crystal-cleaved drawn glass to further recrystallize it, the further heat-treatment being conducted before, during or after the application of pressure in the step (e).

The cover of the metal such as silver is provided around the whole surface of the ceramic wire by any known means such as insertion in a pipe of the metal, dipping into a molten bath of the metal and covering with tape(s) of the metal.

The pressing is conducted by applying preferably about 1000 kg/cm$^2$ to the drawn superconducting wire with or without the metal cover by rolling or other pressing machines.

Figure 2:
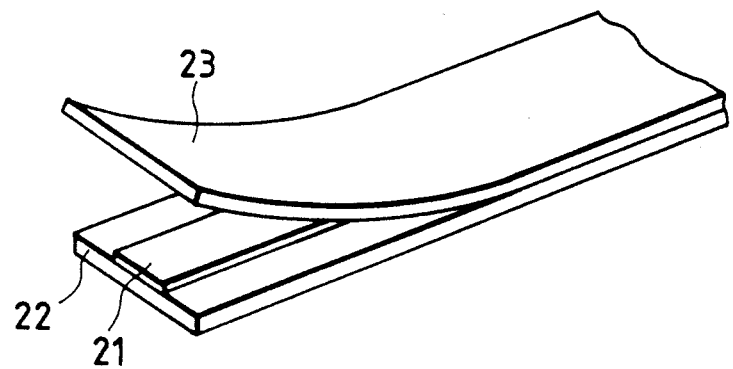
FIG. 2 is a perspective view of an assembly of a metal cover and a wire to be pressed.

FIG. 2 shows as an example, a wire 21 sandwiched between two silver foils 22 and 23 to be pressed towards right angular direction against plain. The pressing causes the crystal orientation of the wire.

The heat-treatment is again carried out here with respect to the superconducting wire with or without being subjected to the above other treatments. This is carried out according to the 2nd stage heating. The combination of the pressing and the heat-treatment is preferable and carried out in such a manner that the heat-treatment is effected with respect to a wire, having been pressed, to be pressed, or during pressing. Such treatment in combination may be repeated several times, and significantly enhances the Jc of the resultant superconducting ceramic wire.

Strictly speaking, the composition of ceramics may be nominal because a little part of metals including Pb must be lost by evaporation during the heating steps in the method of the present invention. Thus the present composition should be noted nominally and based on the chemical composition which is the starting material of the present method.

According to the present invention, the drawbacks of the prior art can be obviated. That is, the melting-quenching step enables the production of a long glass wire having continuity, desired dimension, for example desired thickness, good flexibility and processability. The heat-treatment is carried out in an atmosphere where oxygen can freely go in and out, and hence prevents insufficiency of oxygen in the resulting superconducting ceramics. Also, the heat-treatment enables a high density ceramic wire having a high Jc to obtain due to the use of an oxide glass which is amorphous and has a substantially theoretical density as compared with the use of a sintered oxide of the prior art. The superconducting ceramic wire obtained according to the present invention is expected to be applied to a transfer cable or magnet.

The invention will explained in more detail by way of the following Examples and characterization.

EXAMPLES

EXAMPLE 1

A chemical composition was prepared by homogeneously mixing $Bi_2O_3$, PbO, $SrCO_3$, $CaCO_3$ and CuO in a pulverized form so that the metal ratio became Bi:Pb:Sr:Ca:Cu = 1.6:0.4:2:2:3. The composition was molten at a temperature of 1150° C. for 40 minutes in an alumina crucible. The resulting homogeneous melt was poured onto an iron plate, covered by another iron plate, and pressed into a glass preform having a thickness of 2 mm. The glass plate was cut into a dimension of 5 cm in width and 7 cm in length, and fixed longitudinally onto an end of a dummy rod in a wire-drawing apparatus shown in FIG. 1. The glass plate was wire-drawn at a temperature of 435° C. to obtain a tape wire having 1.5 mm width, 100 $\mu$m thickness and 10 m length, which has such a superior flexibility that it can be wound onto a mandrel of 10 mm in diameter.

The wire was placed on a polycrystalline magnesia (MgO) plate in a heat-treating furnace, heat-treated by 1st stage heating at 430° C. for 4 hours and then by 2nd stage heating at 820° C. for 60 hours.

Thus obtained superconducting ceramic wire had a superconducting property of the critical temperature $Tc(R=O) = 86°$ K. and the critical current density $Jc = 100$ A/cm$^2$ (at 77° K. in the zero magnetic field) as determined by the conventional four-point probe method.

EXAMPLE 2

Example 1 was repeated, except that the 1st stage heating was carried out at a 423° C. for 4 hours and the 2nd stage heating was at 860° C. for 100 hours.

The wire obtained had 1.4 mm width, 100 $\mu$m thickness and 10 m length, and a property of $TC(R=O) = 101°$ K. and $Jc = 100$ A/cm$^2$ (77° K., zero magnetic field).

EXAMPLE 3

Example 1 was repeated, except that a chemical composition was prepared by adding $Ag_2O$ to the chemical composition of Example 1 in an amount of 20% by weight thereof. The same procedure was repeated twice, and two ceramic wires (A and B), both having 1.5 mm width, 100 $\mu$m thickness and 10 m, were obtained.

Further the wires had such superior flexibility that they could be wound onto mandrels of 10 mm in diameter.

The superconducting property was determined and shown below:

Wire A: $Tc(R=O) = 87°$ K., $Jc = 250$ A/cm$^2$ (77° K., zero magnetic field)

Wire B: $Tc(R=O) = 102°$ K., $Jc = 250$ A/cm$^2$ (77° K., zero magnetic field)

The enhancement of critical current density, Jc, as compared with that of the wire obtained in Example 1, is thought to be resulted from the addition of Ag which will accelerate crystal formation and make the ceramic tissue denser.

EXAMPLE 4

Example 1 was repeated, except that the 1st stage heating was omitted and the 2nd stage heating was carried out in such a manner that the tape wire was heated directly from room temperature to 820° C. and maintained at this temperature for 60 hours in the heating apparatus.

The property of the thus obtained wire is as follows; $Tc(R=O) = 40°$ K., $Jc = 10$ A/cm$^2$ (4.2° K., zero magnetic field).

The property is inferior as compared with those of wire obtained in Examples 1 and 2, but almost sufficient superconductivity is obtained.

EXAMPLE 5

Example 4 was repeated, except that the temperature and time of the 2nd stage heating were 860° C. and 100 hours.

The property of the thus obtained wire is as follows; $Tc(R=O) = 80°$ K., $Jc = 10$ A/cm$^2$ (77° K., zero magnetic field).

EXAMPLE 6

The superconducting ceramic wire obtained according to Example 1 was sandwiched between two silver foils of 3 mm width and 300 $\mu$m thickness and a pressure of 20 ton/cm$^2$ was applied (as shown in FIG. 2). Then the wire was heat-treated at 850° C. for 50 hours. The combination of the pressing and heat-treatment was repeated once more.

The critical current density of the thus obtained wire is as high as 3500 A/cm$^2$ at 77° K., in the zero magnetic field.

EXAMPLE 7

Example 1 was repeated except that the chemical composition was previously calcined at 800° C. for 10 hours, pulverized and well mixed, the melting time was 20 minutes and the second heating was carried out at 860° C. for 240 hours.

The property of the thus obtained wire is as follows; $Tc(R=O) = 68°$ K., $Jc = 51$ A/cm$^2$ (4.2° K., zero magnetic field).

EXAMPLE 8

Example 1 was repeated, except that the melting temperature was 1300° C.

The property of the thus obtained wire is as follows: $Tc(R=O)=28°$ K., $Jc=2$ A/cm$^2$ (4.2° K.).

The inferior property as compared with that of the wire obtained in Example 1 is probably a result of an alteration of the system by contamination of the crucible component due to the high melting temperature.

EXAMPLE 9

Example 1 was repeated except that the chemical composition was prepared by mixing homogeneously Bi$_2$O$_3$, SrCO$_3$, CaCO$_3$ and CuO in a pulverized form so that the ratio becomes Bi:Sr:Ca:Cu=2:2:2:3.

The property of the thus obtained wire is as follows: $Tc(R=O)=32°$ K., $Jc=1$ A/cm$^2$ (at 4.2° K.).

EXAMPLE 10

The superconducting ceramic wire obtained in Example 1 was heat-treated at 423° C. for 4 hours (1st stage heating) and then at 840° C. for 100 hours (2nd stage heating) in an atmosphere of saturated PbO vapor.

The property of the thus obtained wire is as follows: $Tc(R=O)=107°$ K., $Jc=200$ A/cm$^2$ (77° K., zero magnetic field).

EXAMPLE 11

Example 1 was repeated, except that the chemical compounds were homogeneously mixed so that the atomic weight ratio became Bi:Pb:Sr:Ca:Cu=1.8:0.2:2:2:3., and that the melting was carried out in a platinum crucible.

The property of the thus obtained wire is $Tc(R=O)=50°$ K.

EXAMPLE 12

Example 1 was repeated, except that the ratio was Bi:Pb:Sr:Ca:Cu=1.95:1.05:2:2:3., and the melting was carried out in a platinum crucible.

The property of the thus obtained wire is $Tc(R=O)=80°$ K. and $Jc=45$ A/cm$^2$ at 77° K. in the zero magnetic field.

EXAMPLE 13

Example 1 was repeated, except that the ratio was Bi:Pb:Sr:Ca:Cu=2.1:0.9:2:2:3, the melting was carried out in a platinum crucible, wire-drawing was conducted at the linear rate of about 70 cm/sec and about 420° C. under a load of 30 g, and the 2nd heating was carried out at 840° C. for 75 hours.

The property of the thus obtained wire is $Tc(R=O)=109°$ K. and $Jc=1,500$ A/cm$^2$ at 77° K. in the zero magnetic field.

EXAMPLE 14

Example 13 was repeated except that the mixing was carried out in ethyl alcohol which was removed completely by evaporation so that the metal ratio became Bi:Pb:Sr:Ca:Cu=1.8:0.2:2:2:3=2.1:0.9:2:2:3 and the heat-treatment was carried out by the 1st stage heating at 430° C. for 4 hours and then the 2nd stage heating at 840° C. for 75 hours and allowed to cool in furnace.

The property of the thus obtained wire is $Tc(R=O)=92°$ K. and $Jc=200$ A/cm$^2$ at 77° K. in the zero magnetic field.

EXAMPLE 15

Example 14 was repeated except that the 2nd stage heating was carried out at 860° C. for 75 hours in oxygen flow.

The property of the thus obtained wire is $Jc=300$ A/cm$^2$ at 77° K. in the zero magnetic field.

EXAMPLE 16

Example 15 was repeated except that the 2nd heating was carried out with respect to the drawn glass wire on a silver plate.

The property of the thus obtained wire is $Jc=3,950$ A/cm$^2$ at 77° K. in the zero magnetic field.

CHARACTERIZATION

X-ray powder diffraction analysis at room temperature using CuKa radiation was performed to examine phases present in the melt-quenched sample. Differential scanning calorimetry (DSC) measurements to determine the glass transition and crystallization temperatures were carried out in air and melt-quenched samples were heated at a rate of 5K/min. Viscosities under air were determined using the penetration method. The microstructures of fibers were observed using a scanning electron microscope (SEM). As for measurements of superconducting properties, temperature dependence of resistivity and critical current density were measured using an conventional four-probe dc method. The criterion for Jc determination was defined as 1 μv/cm. For electrodes, silver paste was used. Measurements of magnetic susceptibility for superconducting fibers were carried out using the D.C. SQUID system with a temperature-controlled cryostat.

RESULTS AND DISCUSSIONS

1. Bi(Pb)-Sr-Ca-Cu-O Glasses

Figure 3:
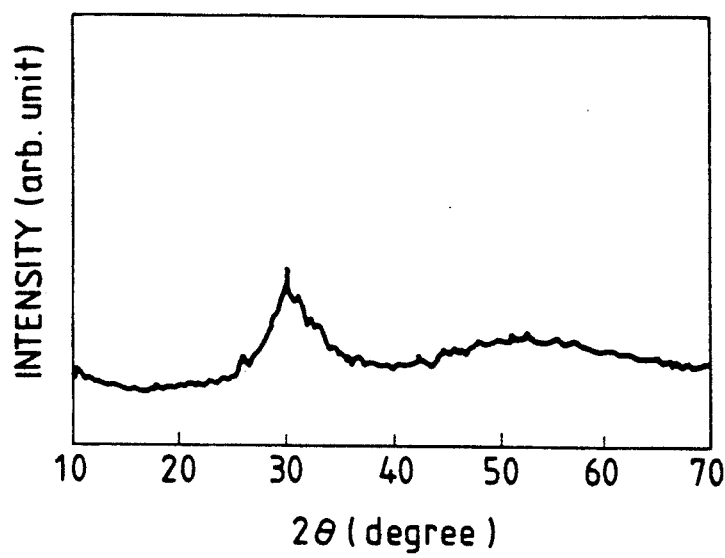
FIG. 3 is an X-ray powder diffraction pattern for the melt-quenched glass.
Figure 4:
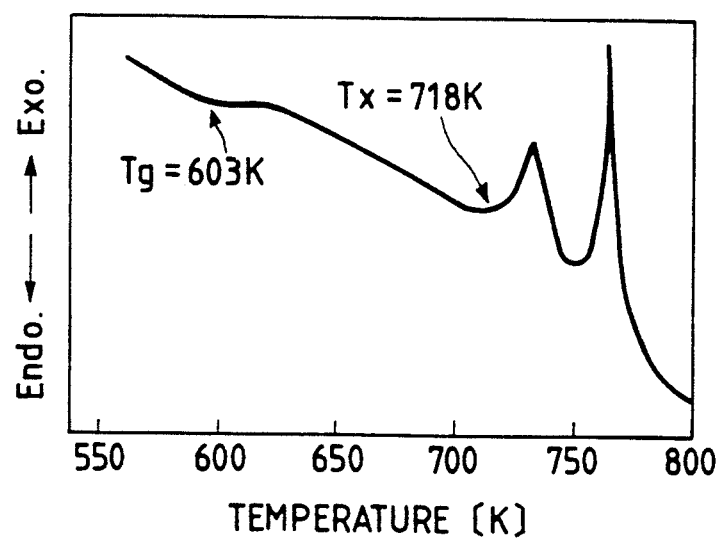
FIG. 4 is a DSC curve for the melt-quenched glass.

FIG. 3 shows the X-ray powder diffraction pattern at room temperature for a melt-quenched sample of Bi$_{1.5}$SrCaCu$_2$O$_y$. A large halo typical of amorphous materials was observed at around 2 $\theta=30°$. A typical DSC curve for the sample is shown in FIG. 4. An endothermic peak due to the glass transition (Tg) and an exothermic peak due to the crystallization (Tx) were clearly observed. The value $\Delta T=Tx-Tg$ is often used as an index of glass stability.

TABLE 1

| Sample No. | Nominal Composition (Bi,Pb):Sr:Ca:Cu | Pb/Bi ratio (%) | Tg [K] | Tx [K] | ΔT (Tx = Tg) [K] |
|---|---|---|---|---|---|
| (1) | 3:2:2:4 | 0 | 603 | 718 | 115 |
| (2) | 2:2:2:3 | 20 | 577 | 724 | 147 |
| (3) | 2:2:2.5:3 | 20 | 573 | 728 | 155 |
| (4) | 2:2:3:3 | 20 | 578 | 736 | 158 |
| (5) | 2.4:2:2:3 | 20 | 583 | 738 | 155 |
| (6) | 3:2:2:3 | 20 | 573 | 727 | 154 |
| (7) | 3:2:2:3 | 30 | 561 | 701 | 140 |

Figure 5:
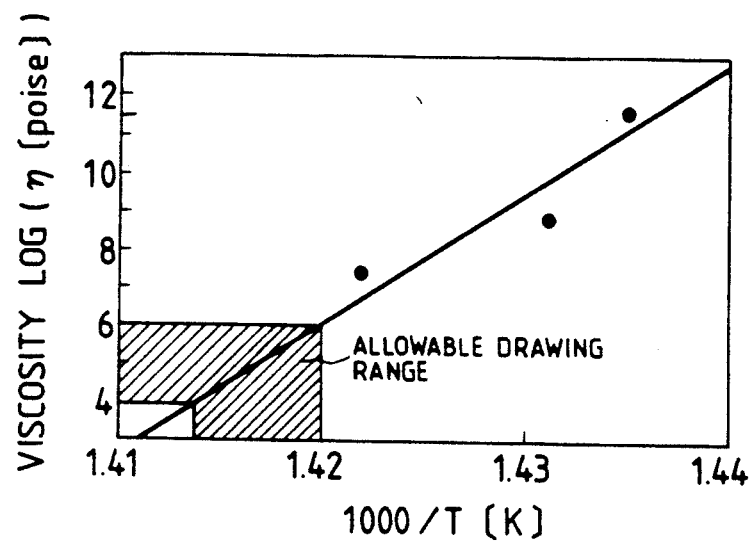
FIG. 5 is a plot showing the temperature dependence of viscosity for the melt-quenched glass.

Table 1 shows the glass transition temperature (Tg), crystallization temperature (Tx) and the thermal stable range (ΔT) of glasses with various compositions. The values of Tg and Tx are in the 560K to 740K range, and the values of ΔT are in the 110K to 160K range, respectively. It was found that the values of ΔT tended to increase with increasing Bi$_2$O$_3$, PbO, and CaO contents. However in the case of the sample (7), the value of ΔT was very narrow compared with that of other samples except for sample (1). These results indicate that Bi$_2$O$_3$, PbO and CaO play important roles in the thermal stability of glasses. Structure of these glasses are not clear now. FIG. 5 shows the temperature dependence of viscosity for the melt-quenched glass of Bi$_{1.5}$Sr- CaCu$_2$O$_y$ (sample(1)). The dash in this figure shows the gradient in the case of the fluoride glass (ZBLAN-F) for comparison with this sample. The gradient of the Bi$_{1.5}$SrCaCu$_2$O$_y$ glass was very steep compared with that of the fluoride glass. The activation energy Ea for viscous flow was 6,300 KJ/mol, which was very large. Furthermore, the shaded portion shows the range which is allowed for drawing, and its range was very narrow (704K–707K). From these results, it is thought that the drawing of these glasses is more difficult than the drawing of conventional oxide glasses like a SiO$_2$ glass. Precise control of drawing temperature at around 705K is needed.

2. (Bi plus Pb)-Sr-Ca-Cu-O Glass Fibers (Bi plus Pb)-Sr-Ca-Cu-O glasses were drawn into fibers using the apparatus shown in FIG. 1. Although the temperature of furnace was slightly different based on glass composition, it was about 707K in the case of the Bi$_{1.5}$SrCaCu$_2$O$_y$ glass. The shape of these fibers was tapelike with a width of 200–500 μm and a thickness of 40–60 μm. If preform supplying and fiber winding systems are added, it will be possible to control the fiber size. Using the simple apparatus shown in FIG. 1, the maximum fiber length obtained was 1200 mm in this composition, and other compositions including Pb, also obtained fibers with a length of 300–400 mm. Furthermore, these fibers were very flexible like a conventional optical fiber, and could not break with a strain of 0.5%.

3. Superconducting Properties

Figure 6:
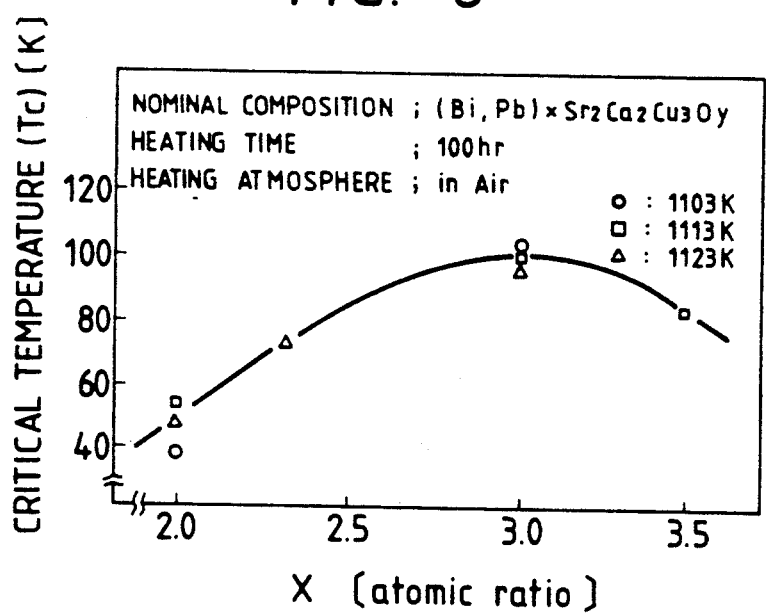
FIG. 6 is a plot showing the nominal composition of the present superconducting wire at various temperatures versus critical temperatures (Tc).
Figure 7:
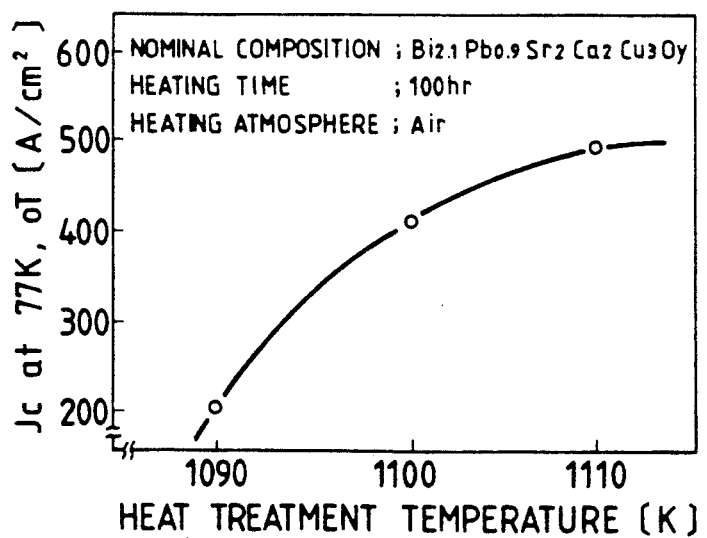
FIG. 7 is a plot showing the heat-treating temperature dependence of critical current density for the present superconducting wire.
Figure 8:
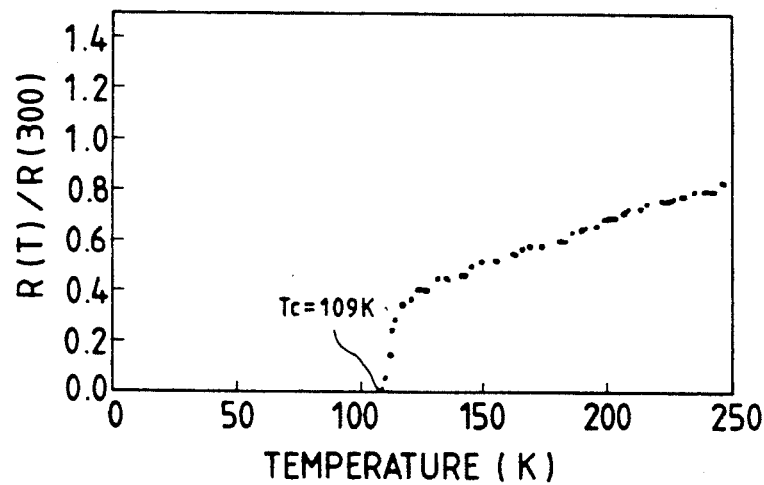
FIG. 8 is a plot showing the temperature dependence of resistivity for the present superconducting wire.

For obtaining superconducting fibers with a large volume fraction of the high-Tc phase, glass fibers including Pb were mainly heat treated. Pb partially substituted for Bi was easy to vaporize during the heat treatment. Therefore, various nominal compositions shown in Table 2 were examined. FIG. 6 shows a nominal composition of fibers heat treated at various temperatures versus critical temperature (Tc). As shown in this figure, the Tc values of fibers tended to increase with increasing Bi and Pb content and had maximums at X=3, respectively. Then the Tc values were not severely affected by a heat treating temperature in the 1103K to 1123K range. FIG. 7 shows the heat treating temperature dependence of critical current density at 77K for Bi$_{2.1}$Pb$_{0.9}$Sr$_2$Ca$_2$Cu$_3$O$_y$ (nominal composition) fibers with a Tc (zero)>100K. It was found that Jc values tend to increase with increasing heat treating temperature. It is thought that the increasing of Jc values directly relates to the volume fraction of 2212 phase (Tc=80K) and 2223 phase (Tc=110K). Therefore it is considered that the heat treatment at higher temperatures below the melting temperatures of fibers is indispensable for obtaining fibers with high Jc values. Temperature dependence of resistivity for the Bi$_{2.1}$Pb$_{0.9}$Sr$_2$Ca$_2$Cu$_3$O$_y$ (nominal composition) fiber heat treated at 1113K for 100 hours in air are shown in FIG. 8.

TABLE 2

| | Nominal compositions of glass fibers containing various Bi and Pb compositions | |
|---|---|---|
| | Nominal Composition | |
| Fiber | (Bi + Pb):Sr:Ca:Cu | Pb/Bi ratio [%] |
| A | 2:2:2:3 | 20 |
| B | 2.3:2:2:3 | 30 |
| C | 3:2:2:3 | 30 |
| D | 3.5:2:2:3 | 30 |

Figure 9:
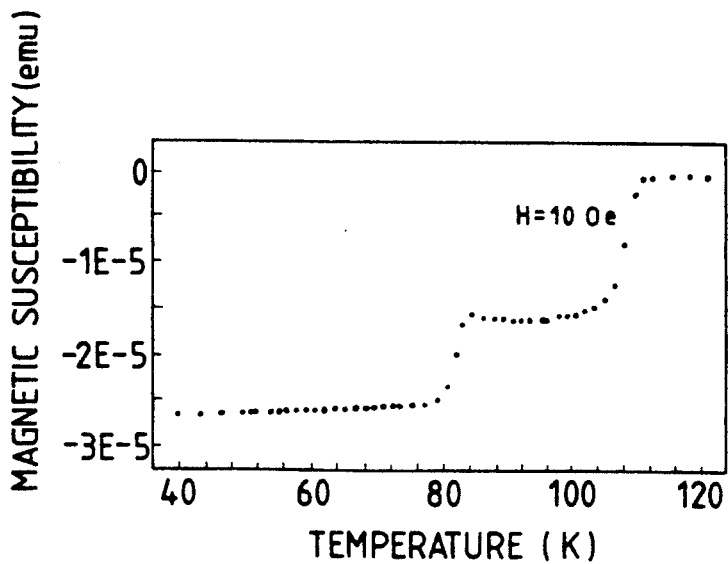
FIG. 9 is a plot showing the temperature dependence of magnetic susceptivity for the present superconducting wire.
Figure 12:
FIG. 12 is a second scanning electron micrograph of the present superconducting wire.

Resistivity dropped with one step and zero resistivity was achieved at a temperature of 109K. Critical current density (Jc) of the fiber at 77K was 550A/cm$^2$. FIG. 9 shows temperature dependence of magnetic susceptibility for the Bi$_{2.1}$Pb$_{0.9}$Sr$_2$Ca$_2$Cu$_3$O$_y$ (nominal composition) fiber heat treated at 1113K for 100 hours in air. As shown in this figure, two superconducting phases with a Tc=110K (2223 phase) and Tc=85K (2212 phase) were detected in this fiber. Values of the volume fraction calculated from magnetic susceptibility were 32% for 2223 phase and 21% for 2212 phase. For obtaining higher Jc, optimal conditions of the heat treatment and nominal compositions are needed. FIG. 12 shows the scanning electron micrograph of the Bi$_{2.1}$Pb$_{0.9}$Sr$_2$Ca$_2$Cu$_3$O$_y$ (nominal composition) fiber heat treated at 1113K for 100 hours in air. The platelike grains, which were regarded as superconducting grains were observed in this figure. In addition, the c-axis of each platelike grain was oriented parallel to the surface of the fiber.

This orientation is peculiar to the samples prepared by this glass-to-ceramic method. It is noted that the growing speed of the a-b plane of the grains is faster than that of the c-axic in the Bi-based superconductor. Therefore, it is considered that the a-b plane of the platelike grain preferentially grows in the direction of the inside of the fiber from the nucleus to the surface.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a superconducting ceramic wire of a Bi system which comprises:
   (a) homogeneously melting a mixture of oxygen-bearing metal compounds capable of being converted into a glass and into a superconducting ceramic, and quenching the melt to form glass,
   (b) forming a perform of the glass,
   (c) drawing the preform into a wire while maintaining the amorphous state of the glass,
   (d) heat-treating the drawn glass to cause recrystallization thereof,
   (e) applying pressure to the recrystallized drawn glass in the step (d) without a metal cover to cause the orientation of crystals, and
   (f) heat-treating the crystal-oriented drawn glass to further recrystallize it, the heat-treatment being conducted before, during or after the application of pressure in the step (3).

2. A method of producing a superconducting ceramic wire of a (Bi plus Pb)-Sr-Ca-Cu-O system in which Pb is absent or present in an atomic ratio of up to 35% of (Bi plus Pb) which comprises:
   (a) homogeneously melting a mixture of oxygen-bearing metal compounds capable of being converted into a superconducting ceramic and quenching the melt to form glass,
   (b) forming a preform of the glass,
   (c) drawing the preform into a wire while maintaining the amorphous state of the glass,
   (d) heat-treating the drawn glass to cause recrystallization thereof, (e) applying pressure to the recrystallized drawn glass in the step (d) without a metal cover to cause the orientation of crystals and (f) heat-treating the crystal-oriented drawn glass to further recrystallize it, the heat-treatment being conducted before, during or after the application of pressure in the step (e).

3. A method of producing a superconducting ceramic wire according to claim 1, wherein Pb is present.

4. A method of producing a superconducting ceramic wire of a (Bi plus Pb)-Sr-Ca-Cu-O system in which Pb is absent or present in an atomic ratio of up to 35% of (Bi plus Pb) which comprises:

(a) homogeneously melting a mixture of oxygen-bearing metal compounds capable of being converted into a superconducting ceramic and quenching the melt to form glass, (b) forming a preform of the glass, (c) drawing the preform into a wire while maintaining the amorphous state of the glass, (d) heat-treating the drawn glass to cause recrystallization thereof, (e) applying pressure to the recrystallized drawn glass in step (d) with a metal cover to cause the orientation of crystals, and (f) heat-treating the crystal-oriented drawn glass to further recrystallize it, the heat-treatment being conducted before, during or after the application of pressure in the step (e).

5. A method of producing a superconducting ceramic wire according to claim 4, wherein steps (e) and (f) are repeated several times.

6. A method of producing a superconducting ceramic wire according to claim 2, wherein the system contains the metals in a nominal ratio of (Bi plus Pb):Sr:Ca:Cu = 2-4:2:2:3 or 4

7. A method of producing a superconducting ceramic wire according to claim 2, wherein the nominal ratio is 2:2:2:3 or 3:2:2:3.

8. A method of producing a superconducting ceramic wire according to claim 2, wherein Pb is present in said system from 10 to 35% of (Bi plus Pb).

9. A method of producing a superconducting ceramic wire according to claim 2, wherein said melting is carried out at 1150° C. ±100° C.

10. A method of producing a superconducting ceramic wire according to claim 2, wherein the quenching is conducted by pouring the glass onto a metal plate.

11. A method of producing a superconducting ceramic wire according to claim 2, wherein the quenched glass is subjected to relaxation of internal stress.

12. A method of producing a superconducting ceramic wire according to claim 2, wherein said drawing into a wire is carried out at a temperature corresponding to a viscosity of $10^6$–$10^4$ poises of the drawn glass.

13. A method of producing a superconducting ceramic wire according to claim 2, wherein said heat-treatment is conducted at a temperature sufficient for making the rate of growth of crystals maximum.

14. A method of producing a superconducting ceramic wire according to claim 13, wherein said temperature is 800° C. to 870° C.

15. A method of producing a superconducting ceramic wire according to claim 13, wherein before said heat-treatment a further heat-treatment is conducted at a temperature sufficient for making the rate of formation of crystal nuclei maximum.

16. A method of producing a superconducting ceramic wire according to claim 15, wherein said temperature is 420° C. to 430° C. which corresponds to a viscosity ranging from $10^{11}$ to $10^{12}$ poises of the drawn glass.

17. A method of producing a superconducting ceramic wire according to claim 2, wherein said heat-treatment is conducted in air or $O_2$ gas.

18. A method of producing a superconducting ceramic wire according to claim 2, wherein said heat-treatment is conducted in the atmosphere of saturated PbO vapor.

19. A method of producing a superconducting ceramic wire according to claim 2, wherein said heat-treatment is conducted while partly contacting the drawn glass with silver.

20. A method of producing a superconducting ceramic wire according to claim 2, wherein said heat-treatment is conducted with respect to the drawn glass placed on a silver plate in $O_2$ flow.

21. A method of producing a superconducting ceramic wire according to claim 2, wherein the mixture containing a metal carbonate or nitrate is previously calcined at about 800° C. and remove resulting carbon or nitrate therefrom.

22. A superconducting ceramic wire produced by the method of claim 1.

23. A superconducting ceramic wire of a (Bi plus Pb)-Sr-Ca-Cu-O system in which Pb is absent or present up to 35% of (Bi plus Pb) produced by the method of claim 2.

* * * * *